(12) United States Patent
Grabinski

(10) Patent No.: US 8,884,671 B2
(45) Date of Patent: Nov. 11, 2014

(54) PHASE-LOCKED LOOP SYSTEM AND OPERATION

(71) Applicant: Synopsys, Inc., Mountain View, CA (US)

(72) Inventor: Jan Grabinski, Gdansk (PL)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 14/251,228

(22) Filed: Apr. 11, 2014

(65) Prior Publication Data

US 2014/0306741 A1    Oct. 16, 2014

(30) Foreign Application Priority Data

Apr. 12, 2013   (EP) .................................. 13163582

(51) Int. Cl.
   *H03L 7/087*       (2006.01)
   *H03L 7/07*        (2006.01)

(52) U.S. Cl.
   CPC ...................................... *H03L 7/07* (2013.01)
   USPC ............... 327/156; 327/147; 331/14; 331/17; 375/375

(58) Field of Classification Search
   USPC ........ 327/147, 148, 156, 157; 331/14, 16, 17; 375/373, 375, 376
   See application file for complete search history.

(56) References Cited

U.S. PATENT DOCUMENTS

| | | | |
|---|---|---|---|
| 4,156,855 A | | 5/1979 | Crowley |
| 6,621,354 B1 * | | 9/2003 | Kornblum et al. ............... 331/14 |
| 7,310,401 B2 * | | 12/2007 | Knotts .......................... 375/376 |
| 7,369,000 B2 * | | 5/2008 | Wu et al. ....................... 331/1 R |
| 7,564,280 B2 * | | 7/2009 | Lin ............................... 327/156 |
| 7,764,129 B1 * | | 7/2010 | Wong et al. ..................... 331/44 |

OTHER PUBLICATIONS

Cheng, K-H. et al., "A Novel All Digital Phase Locked Loop (ADPLL) with Ultra Fast Locked Time and High Oscillation Frequency," IEEE, 2001, pp. 139-143.
Hsieh, F-J. et al., "Fast Locking PLL With All-Digital Locked-Aid Circuit," 2010 IEEE International Conference of Electron Devices and Solid-State Circuits (EDSSC), IEEE, 2010, 4 pages.
Kuo, Y-F. et al., "A Fast Locking PLL With Phase Error Detector," IEEE, 2005, pp. 423-426.
Woo, K. et al., "Fast-Lock Hybrid PLL Combining Fractional-$N$ and Integer-$N$ Modes of Differing Bandwidths," IEEE Journal of Solid-State Circuits, Feb. 2008, pp. 379-389, vol. 43, No. 2.

* cited by examiner

*Primary Examiner* — Patrick O'Neill
(74) *Attorney, Agent, or Firm* — Fenwick & West LLP

(57) ABSTRACT

A phase-locked loop system has a controlled oscillator that provides an output clock signal based on a oscillator control signal, a feedback path configured to provide a feedback signal based on the output clock signal, a phase detector configured to provide a phase dependent signal based on the feedback signal and a reference clock signal, a phase evaluation block configured to provide the oscillator control signal based on the phase dependent signal, a frequency detector that determines whether the frequency ratio between the output clock signal and the reference clock signal has a desired value, and a control logic. The control logic is configured to, during a start-up period, disable the phase evaluation block upon determination of the desired value of the frequency ratio; detect, after disabling the phase evaluation block, a subsequent clock edge of the reference clock signal; and enable, in response to the detection of the subsequent clock edge, the phase evaluation block.

16 Claims, 4 Drawing Sheets

PHASE-LOCKED LOOP SYSTEM AND OPERATION

CROSS REFERENCE TO RELATED APPLICATIONS

This application claims a benefit of, and priority to, European Patent Application No. EP 13163582.3, filed Apr. 12, 2013, the contents of which is incorporated herein by reference.

BACKGROUND

1. Field

The disclosed configuration relates to a phase-locked loop system and to a method for operating a phase-locked loop.

2. Description of Related Art

Conventional phase-locked loops usually comprise a controlled oscillator for providing an output clock signal being controlled by some kind of control signal. A feedback signal is generated on the basis of the output clock signal and provided to a phase detector together with a reference clock signal. The phase detector provides a phase dependent signal, which for example is processed by means of a loop filter that outputs the control signal for the controlled oscillator.

During normal operation, the phase-locked loop keeps the output clock signal at a desired frequency and at a desired phase. However, during a start-up period, the phase-locked loop needs to control the controlled oscillator from a starting frequency being different from the desired output clock frequency such that both the desired frequency and the desired phase are met. It is desirable that such a start-up period is as short as possible.

To achieve a short start-up period, conventional phase-locked loops increase a gain of the control loop in order to achieve a faster change of the output frequency. However, this leads to frequency overshoots, i.e., an output frequency being higher than the desired output frequency. Hence, in such conventional approaches, the output frequency oscillates around the desired output frequency until the correct frequency and phase are reached.

SUMMARY

Disclosed is an improved concept for operating a phase-locked loop during a start-up period that allows arriving at a steady state of the phase-locked loop in a shorter time. As disclosed herein, a start-up period does not only cover a change of the output frequency of the phase-locked loop from a zero frequency to the desired output frequency, but also transitions between different output frequencies.

Further, it is noted that "right", "desired" or "correct" value for the output frequency or a ration refers to a value which is expected to be observed in a stable state of the phase-locked loop. For example, when the frequency of the phase-locked loop should change from 1 GHz to 1.5 GHz, the frequency will be regarded "right", "desired" or "correct" when the frequency at the output of the phase-locked loop system will reach 1.5 GHz and settle with negligible error.

The disclosed configuration is based on the idea that a start-up period of a phase-locked loop may be divided into two stages. During the first stage, the right frequency is tuned and during the second stage the correct phase is tuned. Hence, according to the improved concept, during the frequency tuning stage a time instant is determined, at which the desired output frequency, irrespective of the phase, is reached. At that instant, the input of the controlled oscillator is controlled to be constant. Furthermore, at that instant, the second stage, i.e. the phase tuning stage, starts. In this second stage, it is detected when a subsequent clock edge of the reference clock signal occurs and variation of the control signal of the controlled oscillator is then allowed. Hence, both frequency and phase of the output clock signal have their desired values. The improved concept, for example, eliminates or at least reduces a frequency overshoot and therefore can achieve a short start-up time. Furthermore, the improved concept can also be combined with conventional approaches like increasing a gain of the control loop during the frequency tuning stage.

For example, a phase-locked loop system comprises a controlled oscillator configured to provide an output clock signal on the basis of an oscillator control signal, a feedback path configured to provide a feedback signal on the basis of the output clock signal, a phase detector configured to provide a phase dependent signal on the basis of the feedback signal and the reference clock signal, and a phase evaluation block configured to provide the oscillator control signal on the basis of the phase dependent signal.

According to one example embodiment, a phase-locked loop system comprises a control logic and a frequency detector configured to determine whether a frequency ratio between the output clock signal and the reference clock signal has a desired value. The control logic is configured, during a start-up period, to disable the phase evaluation block upon determination of the desired value of the frequency ratio in order to keep the oscillator control signal constant or at least basically constant, to detect, after disabling the phase evaluation block, a subsequent clock edge of the reference clock signal, and to enable, in response to the detection of the subsequent clock edge, the phase evaluation block in order to allow a variation of the oscillator control signal.

In such an embodiment, in particular the control logic in combination with the frequency detector allows the application of the improved concept and the achievement of a short start-up time.

For example, the control logic is configured such that a time interval between disabling and enabling the phase evaluation block is equal to or less than a clock period of the reference clock signal. Hence, the phase tuning stage according to the improved concept is not longer than one reference clock period.

According to various embodiments, the frequency detector comprises an edge counter for determining the frequency ratio. For example, evaluating the counted clock edges of the output clock signal is used to determine whether the desired output frequency has been reached.

According to some embodiments, the frequency detector is configured to estimate an instant when the frequency ratio has the desired value based on an evaluation of the reference clock signal and the output clock signal. For example, frequency changes of the output clock signal, which usually has a higher frequency than the reference clock signal, are determined during one or more clock periods of the reference clock signal. Hence, the instant of the frequency ratio having the desired value can be estimated even within a fractional clock period of the reference clock signal.

According to various embodiments, the phase-locked loop system comprises a feedback divider in its feedback path. The feedback divider is configured to provide the feedback signal as a frequency divided version of the output clock signal. To this end, the feedback divider comprises a counter for counting clock edges of the output clock signal. For example, during normal operation or steady state operation, the feedback divider provides a clock edge at its output if a preset number of clock edges of the output clock signal have passed.

According to an embodiment, the control logic is configured, in response to the detection of the subsequent clock edge, to reset the counter of the feedback divider to a predetermined starting value. With this resetting, a predetermined phase difference between the feedback signal and the reference clock signal can be set. For example, the predetermined starting value may be zero. However, also a value which is different from zero can be set corresponding, for example, to a static phase error determined in advance by calculation or measurement.

According to some embodiments, a divider ratio of the feedback divider corresponds to the desired value of the frequency ratio.

According to various embodiments, the phase evaluation block comprises a loop filter, in particular a low pass filter, being configured to provide the oscillator control signal. The control logic is configured to disable the phase evaluation block by controlling an input of the loop filter to have a constant or basically constant value. The constant or basically constant value at the loop filter input hence effects that also the output of the loop filter maintains a constant or basically constant value. Hence, the controlled oscillator has no, or little, variations of the oscillator control signal at its input.

In a development, the phase-locked loop system further comprises a charge pump connected upstream to the loop filter. The control logic is further configured to disable the phase evaluation block by disabling the charge pump, in particular a current output of the charge pump, and to enable the phase evaluation block by enabling the charge pump. For example, if no current is output by the charge pump in the disabled state, the input of the loop filter can be kept constant, in particular if the loop filter comprises capacitive elements.

For example, with the embodiments of having the loop filter, the controlled oscillator may comprise a voltage controlled oscillator. In such embodiments, the oscillator control signal is a control voltage provided by the loop filter.

For example, the loop filter comprises a series connection of a resistive element and a first capacitive element, the series connection being connected in parallel to a second capacitive element. A switch is connected in parallel to the resistive element. The control logic is configured, during the start-up period, to keep the switch closed, and to open the switch after disabling the phase evaluation block, in particular disabling the charge pump, and before or with the detection of the subsequent clock edge. Hence, a current flow from the second capacitive element over the resistive element is prevented due to the negligible resistance of the closed switch.

In various embodiments of the phase-locked loop system, the control logic is configured, during the start-up period, to operate the controlled oscillator, the feedback path, the phase detector and the phase evaluation block as an open loop. For example, the open loop operation is performed by changing the function of the phase detector acting as a closed loop interface.

For example, the phase detector comprises a first input for receiving the reference clock signal and a second input for receiving the feedback signal. Furthermore, the control logic is configured to provide a fixed value to one input of the first and the second inputs during the open loop operation.

For example, if the target output frequency is higher than the output frequency at the beginning of the respective start-up period, the fixed value is provided to the second input instead of the feedback signal. If the target output frequency is lower than the output frequency at the beginning of the start-up period, the fixed value is provided to the first input instead of the reference clock signal. For example, the fixed value is a zero value.

An embodiment of a method for operating a phase-locked loop according to the improved concept is to be performed with a phase-locked loop that comprises a controlled oscillator configured to provide an output clock signal on the basis of an oscillator control signal, a feedback path configured to provide a feedback signal on the basis of the output clock signal, a phase detector configured to provide a phase dependent signal on the basis of the feedback signal and the reference clock signal, and a phase evaluation block configured to provide the oscillator control signal on the basis of the phase dependent signal. The method comprises determining an instant, when a frequency ratio between the output clock signal and the reference clock signal has a desired value, disabling the phase evaluation block upon determination of the desired value of the frequency ratio in order to keep the oscillator control signal constant or basically constant, detecting, after disabling the phase evaluation block, a subsequent clock edge of the reference clock signal, and enabling, in response to the detection of the subsequent clock edge, the phase evaluation block in order to allow a variation of the oscillator control signal.

Also with a method according to the improved concept, it is possible that a time interval between disabling and enabling the phase evaluation block is equal to or less than a clock period of the reference clock signal.

For example, if the feedback path of the phase-locked loop comprises a feedback divider that is configured to provide the feedback signal as a frequency divided version of the output clock signal and the feedback divider comprises a counter for counting clock edges of the output clock signal, the method may further comprise resetting, in response to the detection of the subsequent clock edge, the counter of the feedback divider to a predetermined starting value. This is similar to the embodiment of the phase-locked loop system described above.

Further embodiments of a method according to the improved concept become easily apparent form the various embodiments described above in conjunction with the phase-locked loop system, in particular the function of the control logic.

BRIEF DESCRIPTION OF THE DRAWINGS

Figure (FIG. in the drawings) 1 shows an embodiment of a phase-locked loop system.

DETAILED DESCRIPTION

The text below explains the disclosed configuration in detail using exemplary embodiments with reference to the drawings. Same references are used for same elements or circuit parts, or elements or circuit parts having a similar function in the various figures. Hence, the description of elements of circuit parts in one figure may not be repeated in the following figures.

Figure 1:
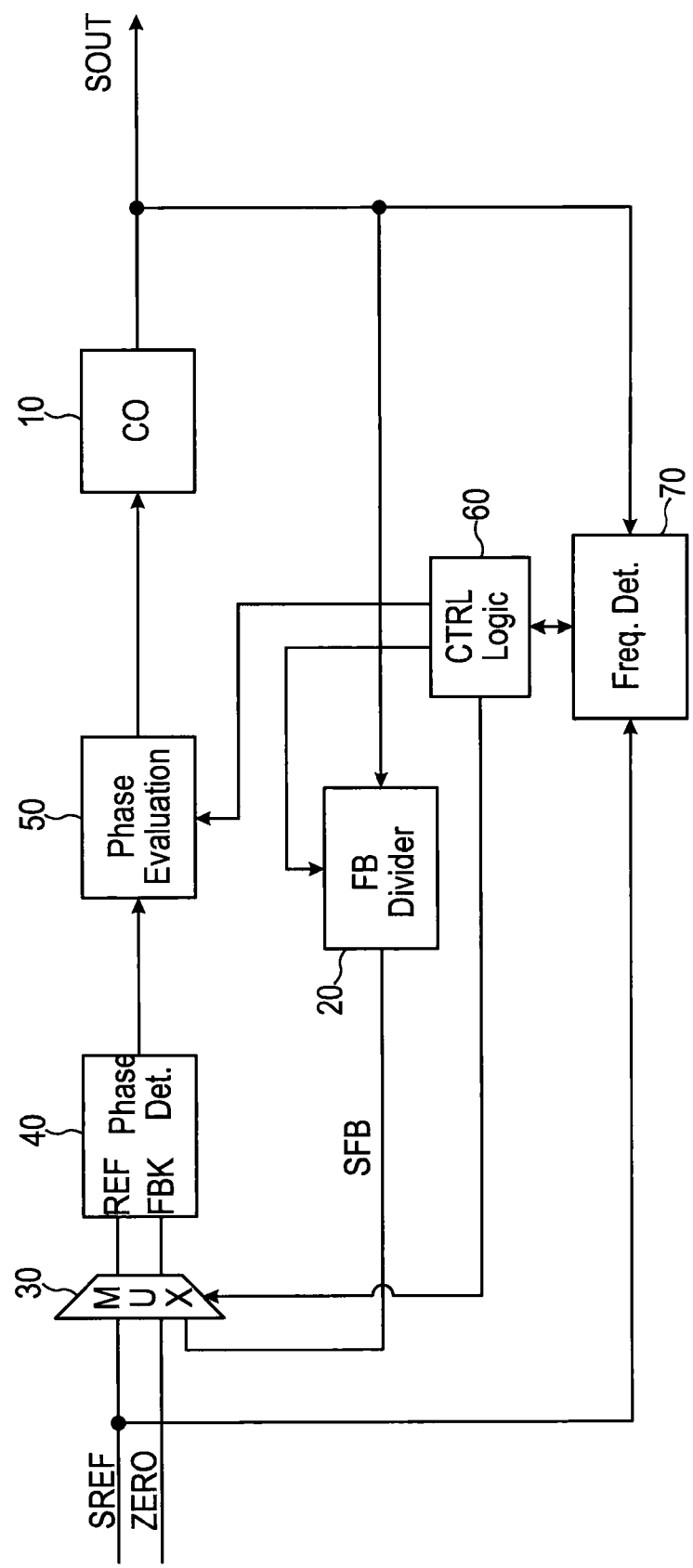

FIG. 1 shows an exemplary embodiment of a phase-locked loop system according to the improved concept. The phase-locked loop system comprises a controlled oscillator 10 that provides an output clock signal SOUT at its output. The output clock signal SOUT is fed back to a feedback divider 20 in a feedback path of the phase-locked loop system. The feedback divider 20 provides a feedback signal SFB at its output to one of three inputs of a multiplexer or multiple switch 30. A further input of the multiplexer 30 is provided with a reference clock signal SREF, which for example is provided by a crystal oscillator, from an external source or the like. A third input of the multiplexer 30 is provided with a fixed value ZERO. The multiplexer 30 has two outputs which are connected to a first input REF and a second input FBK of a phase detector 40. An output of the phase detector 40 is coupled to a phase evaluation block 50, which itself is connected at its output side to a control input of the controlled oscillator 10 for providing an oscillator control signal. The respective functions of the controlled oscillator 10, the feedback path with the feedback divider 20, the phase detector 40 and the phase evaluation block 50 are well-known from conventional phase-locked loops.

For example, during normal operation when an output frequency of the output clock signal SOUT has a desired frequency and a desired phase with respect to the reference clock signal SREF, the respective blocks 10, 20, 40 and 50 perform a phase and frequency control for maintaining the desired output frequency. To this end, the feedback divider 20 provides the feedback signal SFB as a frequency divided version of the output clock signal SOUT, for example using an internal counter for counting clock edges of the output clock signal SOUT. The frequency divided version of the output clock signal SOUT, respectively the feedback signal SFB is provided to the second input FBK of the phase detector 40 during normal operation. Furthermore, the reference clock signal SREF is provided to the first input REF of the phase detector 40. The phase detector 40 determines a phase error between the two input signals SREF, SFB and provides such phase dependent signal to the phase evaluation block 50. For example the phase evaluation block 50 comprises a loop filter or the like. On its output the phase evaluation block 50 provides the oscillator control signal, which controls the output frequency of the controlled oscillator 10. It should be noted that the multiplexer 30 forwards the reference clock signal SREF and the feedback signal SFB during normal operation, whereas the fixed value ZERO is not used during normal operation.

The embodiment of the phase-locked loop system according to the improved concept further comprises a control logic 60 and a frequency detector 70. The frequency detector 70 is provided with both the reference clock signal SREF and the output clock signal SOUT and is configured to determine whether the frequency ratio between the output clock signal SOUT and the reference clock signal SREF has a desired value N. For example, the desired ratio N corresponds to the divider ratio of the feedback divider 20. Hence, the frequency detector 70 is able to determine an instant when the frequency ratio has the desired value based on an evaluation of the reference clock signal SREF and the output clock signal SOUT.

To this end, the frequency detector 70 may comprise an edge counter for determining the frequency ratio. Furthermore, the frequency detector 70 may be configured to estimate an instant when the frequency ratio has the desired value. For example, the frequency detector 70 is able to determine a change rate of the output frequency, for instance during a clock period of the reference clock signal SREF, and calculate the instant of reaching the desired output frequency, respectively the desired frequency ratio, based on the frequency change rate. However, other ways of determining an instant of reaching the desired output frequency, respectively desired frequency ratio, may be used.

This information can be used by the control logic 60 during a start-up period of the phase-locked loop system. In particular, such a start-up period occurs if there are any changes desired in the output frequency, for example during a complete start-up from a zero frequency or during a frequency change from a first desired output frequency to a second desired output frequency.

Accordingly, during such start-up period, the control logic 60 controls the phase and frequency tuning of the output frequency in two consecutive stages, namely a first frequency tuning stage and a second phase tuning stage. For example, during the frequency tuning stage, the control logic 60 controls the phase-locked loop blocks 10, 20, 30, 40, 50 to an open loop operation. To this end, the control logic 60 controls the multiplexer 30 to provide the fixed value zero to one of the inputs REF, FBK of the phase detector 40, depending on the direction of the frequency change. For example, if the target output frequency is higher than the output frequency at the moment, the multiplexer 30 is controlled to provide the fixed value ZERO to the input FBK of the phase detector 40, while the reference clock signal SREF is provided to the input REF of the phase detector 40. If the target output frequency is lower than the output frequency at the moment, the multiplexer 30 is controlled such that the fixed value ZERO is provided to the input REF of the phase detector and the feedback signal SFB is provided to the input FBK of the phase detector 40. Such an open loop operation can increase the speed of frequency tuning of the output frequency. However, the open loop operation can also be omitted in various implementations such that also the multiplexer 30 can be seen as an optional feature of the embodiment of FIG. 1.

During the frequency tuning stage the frequency detector 70 determines the instant of the desired frequency ratio, as described above, and provides this information to the control logic 60. At this instant of the so-called correct output frequency, the frequency tuning stage ends and the phase tuning stage can be started.

To this end, the control logic 60 disables the phase evaluation block 50 upon determination of the desired value N of the frequency ratio. This allows the oscillator control signal to be kept constant or at least basically constant, resulting in avoiding or at least minimizing frequency changes at the output of controlled oscillator 10.

After disabling the phase evaluation block 50, hence during the frequency tuning stage, the control logic 60 waits for a subsequent clock edge of the reference clock signal SREF. If such a clock edge of the reference clock signal SREF is detected, the control logic 60 enables the phase evaluation block 50 again in order to allow a variation of the oscillator control signal. For example, the time interval between disabling and enabling the phase evaluation block 50 is equal to or less than a clock period of the reference clock signal SREF. This is based on the fact that the instant of detection of the correct output frequency falls within one clock period of the reference clock signal SREF and the phase evaluation block 50 is only disabled until the next, subsequent clock edge. It is obvious for a skilled person that it is well-defined in the phase-locked loop system whether rising clock edges or falling clock edges are evaluated. Hence, if discussing clock edges herein, such well-defined clock edges are meant.

The control logic 60 is further configured to control the blocks 10, 20, 30, 40, 50 to a closed loop operation again either in response to the detection of the subsequent clock edge of the reference clock signal or in response to the detection of the desired frequency ratio N.

As described before, the feedback divider 20 may comprise a counter for counting clock edges of the output clock signal SOUT. This counter may act as a memory of the phase-locked loop system, as the provision of clock edges in the feedback signal SFB depends on the counter-value and the divider ratio of the feedback divider 20. Hence, at the instant of detection of the subsequent clock edge, the control logic 60 controls the feedback divider to reset the counter of the feedback divider 20 to a predetermined starting value. At this instant an active clock edge is provided in the feedback signal SFB being coincident or basically coincident with the clock edge of the reference clock signal SREF. Hence, no or little phase difference is present at the input of the phase detector 40. In other words, the control logic 60 forces the phase-locked loop system to have both the correct frequency and a correct phase with respect to the output clock signal SOUT. Hence, the phase-locked loop system does not need to apply further control to achieve the desired output frequency such that, for example, overshoot of the output frequency can be avoided. A locked state of the phase-locked loop can be achieved in less time than with conventional phase-locked loops.

The predetermined starting value set in the counter of the feedback divider 20 may be a zero value or a constant value equal zero plus a static phase error value calculated or measured in previous operating periods.

Figure 2:
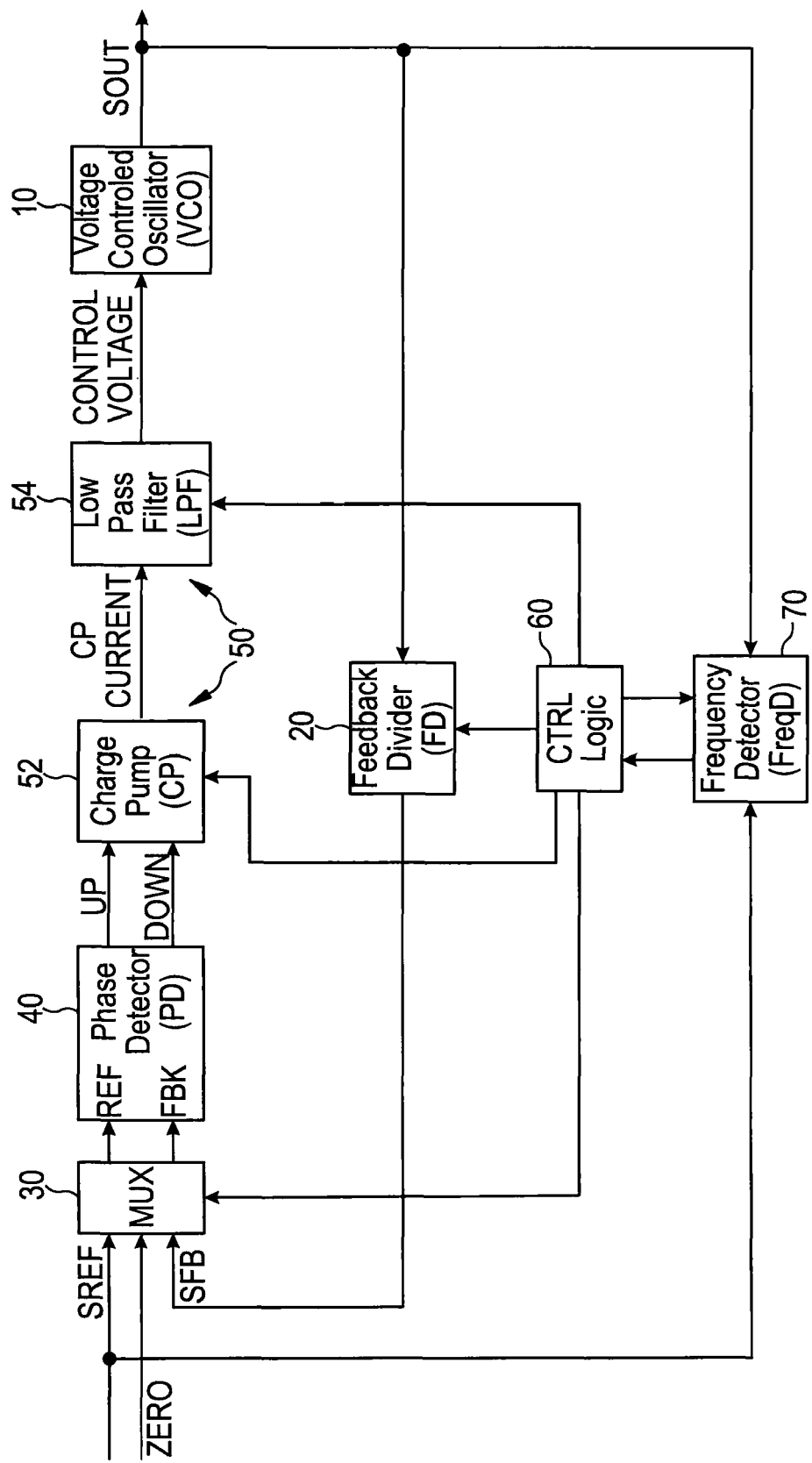
FIG. 2 shows a further embodiment of a phase-locked loop system.

FIG. 2 shows a further embodiment of a phase-locked loop system according to the improved concept, which is based on the embodiment of FIG. 1. Hence, only differing circuit parts or blocks will be described in full detail.

In the embodiment of FIG. 2, the controlled oscillator 10 is specifically implemented as a voltage controlled oscillator, VCO, which is controlled by a control voltage. The phase evaluation block 50 comprises a charge pump 52 and a loop filter 54 that has a low pass characteristic. The charge pump 52 is provided with the phase dependent signal of the phase detector 40 in the form of up and down signals controlling the charge pump 52 to provide more or less current to the low pass filter 54.

During normal operation, in a locked state or steady state of the phase-locked loop, the charge pump 52 provides the charge pump current to the loop filter 54, resulting in a respective control voltage at the output of the loop filter 54 for controlling the VCO 10.

Figure 3:
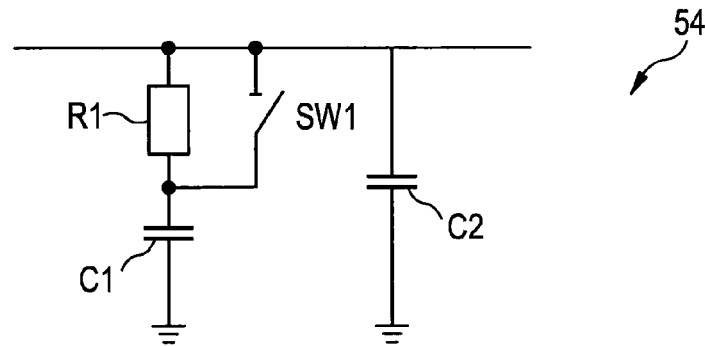
FIG. 3 shows an embodiment of a loop filter.

With respect to FIG. 3, the loop filter 54 may be a second order low pass filter comprising a series connection of a resistive element R1 and a first capacitive element C1, the series connection being connected in parallel to a second capacitive element C2. Furthermore, a switch SW1 is connected in parallel to the resistive element R1. During normal operation, the switch SW1 is in an open state.

Accordingly, if the charge pump current is provided to the loop filter 54, the current charges the capacitive elements C1, C2 resulting in the control voltage for the VCO 10.

Referring back to FIG. 2, the control logic 60 is configured to disable the phase evaluation block 50 by disabling the charge pump 52, in particular current output of the charge pump 52, upon determination of the desired value of the frequency ratio. Accordingly, if no output current is provided to the low pass filter, the charging state and the voltage of the capacitive elements C1, C2 are maintained basically constant. Preferably, at the beginning of the start-up period the control logic 60 controls the switch SW1 to a closed state such that no discharging occurs over the resistive element R1.

As the control voltage of the VCO 10 stays constant, the output frequency of the output clock signal SOUT is also kept constant in this stage of the start-up period. With the detection of the subsequent clock edge, as described before, the control logic enables the phase evaluation block 50 by enabling the charge pump 52 again. Hence, current can be provided to the loop filter 54. Furthermore, the switch SW1 is controlled open. Preferably, the switch SW1 is kept in a closed state during the start-up period until for instance the disabling of the phase evaluation block 50 respectively the charge pump 52, however at the latest with the detection of the subsequent clock edge of the reference clock signal SREF.

Figure 4:
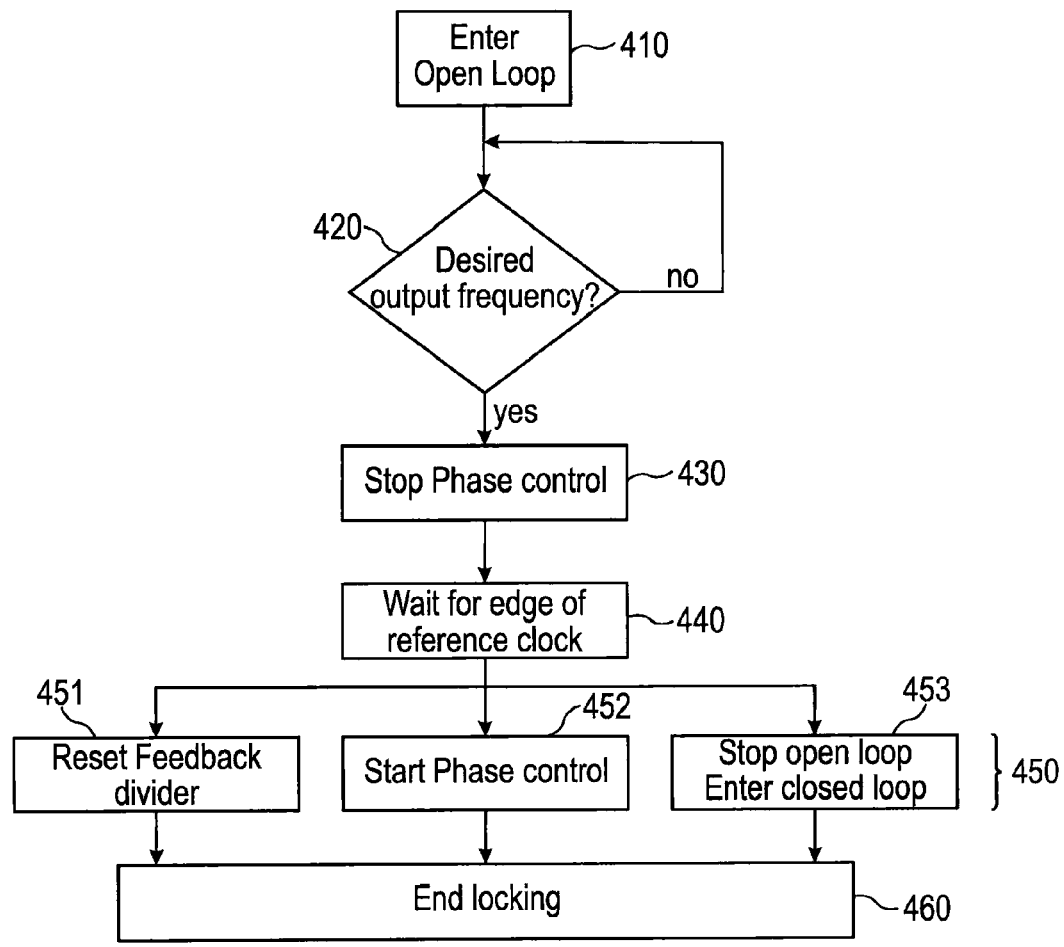
FIG. 4 shows an embodiment of a flow diagram of a method for operating a phase-locked loop.

FIG. 4 shows an exemplary flowchart of a method for operating a phase-locked loop that comprises a controlled oscillator 10, a feedback path with a feedback divider 20, a phase detector 40 and a phase evaluation block 50 as described above in conjunction with FIG. 1 and FIG. 2. However, the operating method is meant to work with any conventional phase-locked loop.

The flowchart of FIG. 4 describes the operation during the start-up period of the phase-locked loop. In block 410 the phase-locked loop is entered into an open loop operation, for example as described before by providing a fixed value to one of the inputs of the phase detector. In block 420 it is determined whether and when the desired output frequency respectively frequency ratio is achieved. As soon as this instant is determined or estimated, phase control is stopped in block 430, for example by disabling the phase evaluation block 50. Furthermore, in block 440 it is waited for a subsequent clock edge of the reference clock signal SREF, in particular an active edge of the reference clock signal SREF.

In response to the detection of the subsequent clock edge, the combined actions 450 are performed preferably concurrently or at least with little time differences. In particular in block 451 the feedback divider, or more specifically the counter of the feedback divider 20, is reset to a predetermined starting value, for example as described above in conjunction with FIGS. 1 and 2.

Furthermore in block 452 the phase control is started again, for example by enabling the phase evaluation block 50 again. Additionally, in block 453 the open loop operation is stopped and the closed loop operation is entered, for example as described above by stopping the providing of a fixed value to one of the inputs of the phase detector. It should be noted that in slightly different implementations, block 453 could also be between block 430 and 440, making little difference because of the short time of less than one clock period of the reference clock signal SREF.

It should be furthermore noted that an open loop operation of the phase-locked loop is also effected by stopping phase control in block 430, and as long as phase control is stopped, no closed loop operation is performed regardless of block 453.

The operating method during the start-up period ends in block 460, resulting in a locked state of the phase-locked loop.

Figure 5:
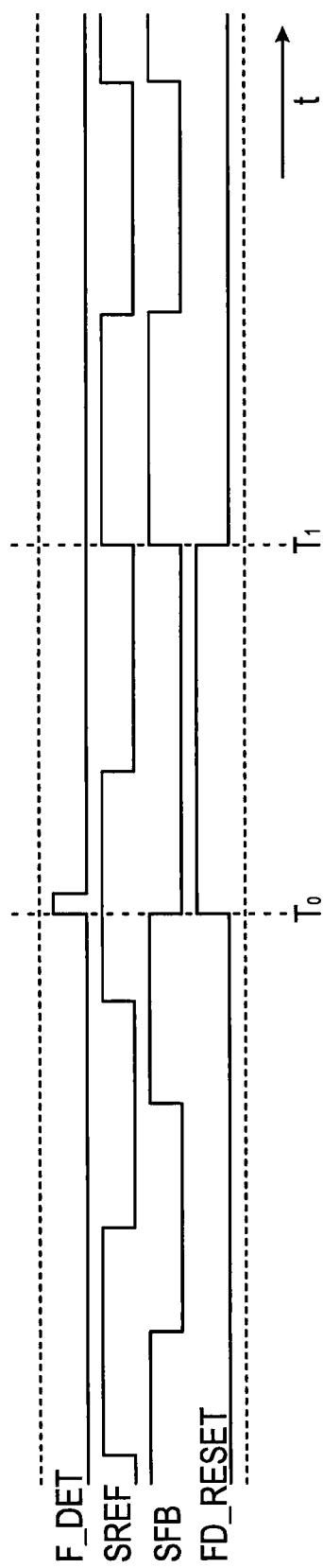
FIG. 5 shows a signal time diagram of clock signals and control signals within the various embodiments of the phase-locked loop system.

FIG. 5 shows an exemplary signal time diagram of signals which may be present in the embodiments of FIG. 1 or FIG. 2. The diagram shows the reference clock signal SREF, the feedback signal SFB, a frequency determination signal F_DET and a reset signal FD_RESET.

The signal time diagram shows an ending part of the start-up period and the beginning of a locked state or normal operation of the phase-locked loop. In particular, frequency tuning is performed up to the time instant T0 which corresponds to the instant when the frequency ratio between the output clock signal SOUT and the reference clock signal SREF has the desired value N. Accordingly, at this instant T0 the frequency detector 70 provides the detection signal F_DET to the control logic 60 which, in response to the detection signal F_DET, provides respective control signals to the feedback divider 20. In particular, the reset signal FD_RESET is provided to the feedback divider 20 resulting in a defined low state of the feedback signal SFB. Upon detection of the subsequent rising or active clock edge of the reference clock signal SREF, at the instant T1, the control logic 60 changes the state of the reset signal FD_RESET resulting in an immediate edge of the feedback signal SFB being coincident with the active edge of the reference clock signal SREF. After the instant T1, the reference clock signal SREF and the feedback signal SFB are basically identical with respect to frequency and phase. Hence, the output clock signal SOUT, not shown here for reasons of a better overview, also has the desired frequency. As described before, at the instant T1 the counter-value of the feedback divider 20 is reset to the predetermined starting value.

A benefit of the disclosed configuration is that overshoot and ringing during start-up periods can be reduced compared to conventional phase-locked loops. Furthermore, the time for locking the phase-locked loop can be decreased significantly. Hence, the phase-locked loop according to the improved concept can easily be powered down and up again during times when the output clock signal SOUT is not needed, instead of continuously operating the phase-locked loop. The control logic 60 and the frequency detector 70 can be implemented with little effort, for example with simple logic circuits.

In various embodiments during the start-up period a voltage for the VCO 10 can be stored in advance and provided to the VCO 10 during the start-up period in order to reach the desired output frequency even faster.

During normal operation the function and presence of the control logic 60 does not influence the operation of the well-known phase-locked loop blocks. Hence, system parameters of the phase-locked loop are not affected by implementing the phase-locked loop system according to the improved concept.

It should be noted that the embodiment of FIG. 2 employing a voltage controlled oscillator is used only as an example. Instead of a voltage controlled oscillator, also a digitally controlled oscillator or a numerically controlled oscillator may be used.

It is noted that the described structural configuration can be designed for layout on, for example, an integrated circuit chip. Such design for layout can be achieved through electronic design automation software. The structural configuration of the design in one embodiment can also be stored in a cell library for use within electronic design automation software. Moreover, the operational characteristics of the designed configuration can be simulated or emulated through electronic design automation software.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the invention. This description should be read to include one or at least one and the singular also includes the plural unless it is obvious that it is meant otherwise.

Upon reading this disclosure, those of skill in the art will appreciate still additional alternative structural and functional designs for a system and a process for phase locked loop system and operation through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A phase-locked loop system, comprising
a controlled oscillator configured to provide an output clock signal (SOUT) on the basis of an oscillator control signal;
a feedback path configured to provide a feedback signal (SFB) on the basis of the output clock signal (SOUT);
a phase detector configured to provide a phase dependent signal on the basis of the feedback signal (SFB) and a reference clock signal (SREF);
a phase evaluation block configured to provide the oscillator control signal on the basis of the phase dependent signal;
a frequency detector configured to determine whether a frequency ratio between the output clock signal (SOUT) and the reference clock signal (SREF) has a desired value (N); and
a control logic, which is configured, during a start-up period,
to disable the phase evaluation block upon determination of the desired value (N) of the frequency ratio in order to keep the oscillator control signal basically constant;
to detect, after disabling the phase evaluation block, a subsequent clock edge of the reference clock signal (SREF); and
to enable, in response to the detection of the subsequent clock edge, the phase evaluation block in order to allow a variation of the oscillator control signal.

2. The phase-locked loop system according to claim 1, wherein a time interval between disabling and enabling the phase evaluation block is equal to or less than a clock period of the reference clock signal (SREF).

3. The phase-locked loop system according to claim 1, wherein the frequency detector comprises an edge counter for determining the frequency ratio.

4. The phase-locked loop system according to claim 2, wherein the frequency detector comprises an edge counter for determining the frequency ratio.

5. The phase-locked loop system according to claim 1, wherein the frequency detector is configured to estimate an instant when the frequency ratio has the desired value based on an evaluation of the reference clock signal (SREF) and the output clock signal (SOUT).

6. The phase-locked loop system according to claim 1, wherein the feedback path comprises a feedback divider that is configured to provide the feedback signal (SFB) as a frequency divided version of the output clock signal (SOUT), the feedback divider comprising a counter for counting clock edges of the output clock signal (SOUT), wherein the control logic is configured, in response to the detection of the subsequent clock edge, to reset the counter of the feedback divider to a predetermined starting value.

7. The phase-locked loop system according to claim 6, wherein a divider ratio of the feedback divider corresponds to the desired value of the frequency ratio.

8. The phase-locked loop system according to claim 1, wherein the phase evaluation block comprises a loop filter, in particular a low-pass filter, being configured to provide the oscillator control signal, wherein the control logic is configured to disable the phase evaluation block by controlling an input of the loop filter to have a basically constant value.

9. The phase-locked loop system according to claim 8, wherein the phase evaluation block further comprises a charge pump connected upstream to the loop filter, wherein the control logic is configured to disable the phase evaluation block by disabling the charge pump, in particular a current output of the charge pump, and to enable the phase evaluation block by enabling the charge pump.

10. The phase-locked loop system according to claim 9, wherein the controlled oscillator comprises a voltage controlled oscillator.

11. The phase-locked loop system according to claim 10, wherein the loop filter comprises a series connection of a resistive element (R1) and a first capacitive element (C1), the series connection being connected in parallel to a second capacitive element (C2), wherein a switch (SW1) is connected in parallel to the resistive element (R1), and wherein the control logic is configured, during the start-up period, to keep the switch (SW1) closed, and to open the switch (SW1) after disabling the phase evaluation block and before or with the detection of the subsequent clock edge.

12. The phase-locked loop system according to claim 1, wherein the control logic is configured, during the start-up period, to operate the controlled oscillator, the feedback path, the phase detector and the phase evaluation block as an open loop.

13. The phase-locked loop system according to claim 12, wherein the phase detector comprises a first input (REF) for receiving the reference clock signal (SREF) and a second input (FBK) for receiving the feedback signal (SFB), wherein the control logic is configured to provide a fixed value to one input of the first and the second inputs (REF, FBK) during the open loop operation.

14. A method for operating a phase-locked loop that comprises a controlled oscillator configured to provide an output clock signal (SOUT) on the basis of an oscillator control signal, a feedback path configured to provide a feedback signal (SFB) on the basis of the output clock signal (SOUT), a phase detector configured to provide a phase dependent signal on the basis of the feedback signal (SFB) and a reference clock signal (SREF), and a phase evaluation block configured to provide the oscillator control signal on the basis of the phase dependent signal, the method comprising:
 determining an instant, when a frequency ratio between the output clock signal (SOUT) and the reference clock signal (SREF) has a desired value (N);
 disabling the phase evaluation block upon determination of the desired value (N) of the frequency ratio in order to keep the oscillator control signal basically constant;
 detecting, after disabling the phase evaluation block (50), a subsequent clock edge of the reference clock signal (SREF); and
 enabling, in response to the detection of the subsequent clock edge, the phase evaluation block in order to allow a variation of the oscillator control signal.

15. The method according to claim 14, wherein a time interval between disabling and enabling the phase evaluation block is equal to or less than a clock period of the reference clock signal (SREF).

16. The method according to claim 14, wherein the feedback path of the phase-locked loop comprises a feedback divider that is configured to provide the feedback signal (SFB) as a frequency divided version of the output clock signal (SOUT), the feedback divider comprising a counter for counting clock edges of the output clock signal (SOUT), wherein the method further comprises resetting, in response to the detection of the subsequent clock edge, the counter of the feedback divider to a predetermined starting value.

\* \* \* \* \*